(12) United States Patent
Miya et al.

(10) Patent No.: US 7,396,771 B2
(45) Date of Patent: Jul. 8, 2008

(54) PLASMA ETCHING APPARATUS AND PLASMA ETCHING METHOD

(75) Inventors: Go Miya, Hachioji (JP); Seiichiro Kanno, Kodaira (JP); Naoshi Itabashi, Hachioji (JP); Motohiko Yoshigai, Hikari (JP); Junichi Tanaka, Hachioji (JP); Masahito Mori, Tokorozawa (JP); Naoyuki Kofuji, Tama (JP); Go Saito, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 106 days.

(21) Appl. No.: 11/362,867

(22) Filed: Feb. 28, 2006

(65) Prior Publication Data

US 2007/0056929 A1   Mar. 15, 2007

(30) Foreign Application Priority Data

Sep. 15, 2005   (JP)   ............................. 2005-268316

(51) Int. Cl.
*H01L 21/461* (2006.01)
*H01L 21/302* (2006.01)

(52) U.S. Cl. .................. 438/706; 438/707; 438/714; 438/719; 438/725

(58) Field of Classification Search .................. None
See application file for complete search history.

(56) References Cited

U.S. PATENT DOCUMENTS

| 6,514,376 | B1 * | 2/2003 | Collins et al. ......... 156/345.37 |
|---|---|---|---|
| 2003/0086840 | A1 * | 5/2003 | Himori et al. ........... 422/186.04 |
| 2006/0016559 | A1 * | 1/2006 | Kobayashi et al. ...... 156/345.34 |
| 2006/0042754 | A1 * | 3/2006 | Yoshida et al. ............ 156/345.1 |
| 2006/0138085 | A1 * | 6/2006 | Chien et al. .................... 216/67 |
| 2006/0162661 | A1 * | 7/2006 | Jung et al. ............. 118/723 ER |

FOREIGN PATENT DOCUMENTS

| JP | 2005-028804 | 2/2005 |
|---|---|---|
| JP | 2005-056914 | 3/2005 |
| KR | 10-2005-0062695 | 6/2005 |

* cited by examiner

*Primary Examiner*—Duy-Vu N Deo
(74) *Attorney, Agent, or Firm*—Antonelli, Terry, Stout & Kraus, LLP.

(57) ABSTRACT

A plasma etching apparatus includes a processing chamber in which a specimen is subjected to plasma processing, a specimen holder for holding the specimen, the specimen holder including a temperature controller for controlling temperatures at at least 2 positions of the specimen, at least two gas supply sources for supplying processing gases, at least two gas inlets for introducing the processing gases into the processing chamber, a regulator for independently controlling the compositions or the flow rates of the processing gases introduced from the at least two gas inlets and the temperatures controlled with at least two temperature controllers in the specimen holder, and an electromagnetic wave supply unit for sending an electromagnetic wave into the processing chamber, wherein the compositions or the flow rates of the processing gases introduced from the gas inlets and the temperature controlled with the temperature controllers in the specimen holder are independently controlled.

4 Claims, 8 Drawing Sheets

CD SHIFT AS A FUNCTION OF SPECIMEN TEMPERATURE

FIG.3B

CD SHIFT AS A FUNCTION OF OXYGEN FLOW RATE

FIG.4A

LARGE CD SHIFT AT DENSE PORTION

FIG.4B

LARGE CD SHIFT AT NONDENSE PORTION

FIG.4E

TARGET CD SHIFT AT DENSE AND NONDENSE PORTIONS

FIG.4C

SMALL CD SHIFT AT DENSE PORTION

FIG.4D

SMALL CD SHIFT AT NONDENSE PORTION

BEFORE ETCHING

FIG.7B

AFTER BARC ETCHING STEP

FIG.7C

AFTER POLYSILICON ETCHING STEP

FIG.8

PLASMA ETCHING APPARATUS AND PLASMA ETCHING METHOD

The present application is based on and claims priority of Japanese patent application No. 2005-268316 filed on Sep. 15, 2005, the entire contents of which are hereby incorporated by reference.

BACKGROUND OF THE INVENTION

1. Field of the Invention

The present invention relates to a plasma etching apparatus for processing a semiconductor substrate, such as a semiconductor wafer, and to a plasma etching method using the plasma etching apparatus.

2. Description of the Related Art

Conventionally, a plasma etching apparatus utilizing reactive plasma has been used to process a semiconductor substrate, such as a semiconductor wafer, in a manufacturing process of a semiconductor device.

Figure 7A:
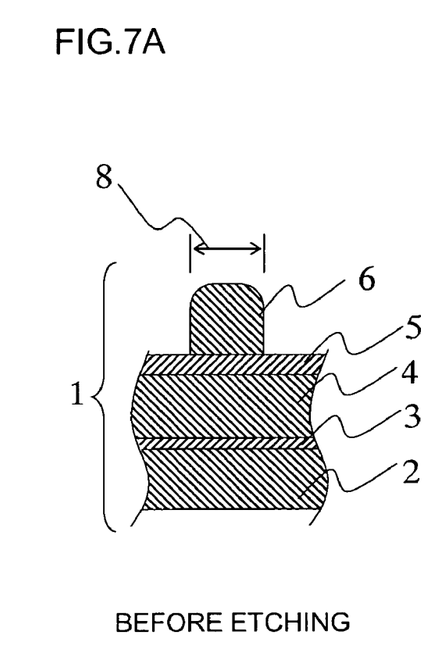
FIG. 7A is a sectional side view of a specimen before gate etching.
Figure 7B:
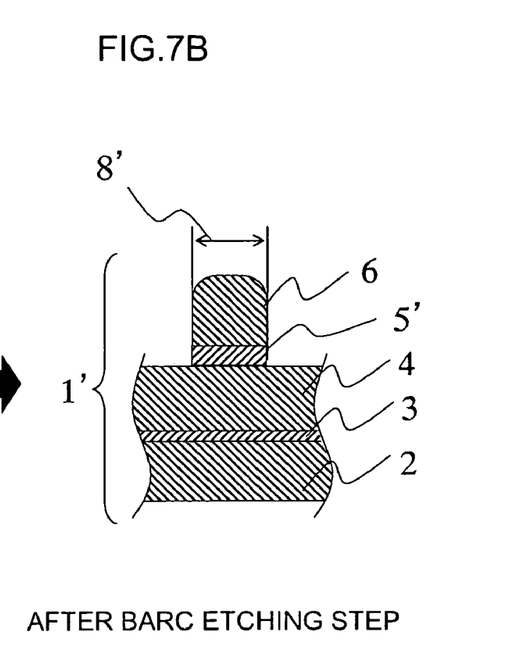
FIG. 7B is a sectional side view of the specimen after BARC etching.
Figure 7C:
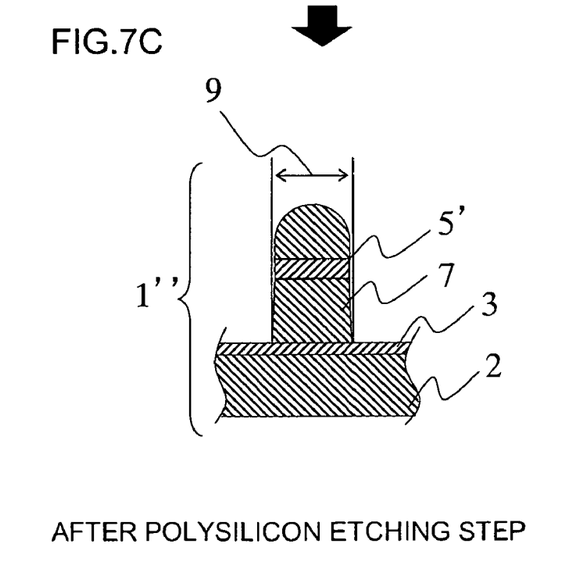
FIG. 7C is a sectional side view of the specimen after polysilicon etching.

As an example of the plasma etching, etching for forming a polysilicon (poly-Si) gate electrode of a metal oxide semiconductor (MOS) transistor (hereinafter referred to as gate etching) is described below with reference to FIGS. 7A to 7C. As illustrated in FIG. 7A, a specimen 1 before etching is composed of a silicon (Si) substrate 2, a silicon dioxide ($SiO_2$) film 3, a polysilicon film 4, an antireflection coating (also referred to as bottom anti-reflective coating: BARC) 5, and a photoresist mask 6, from the bottom. The gate etching involves a BARC etching process and a polysilicon etching process. In the gate etching, the polysilicon film 4 in an area not covered with the photoresist mask 6 or the antireflection coating 5 is removed by exposing the specimen 1 to reactive plasma.

In the BARC etching process, the antireflection coating 5 in an area not covered with the photoresist mask 6 is removed by exposing the specimen 1 to reactive plasma. After the BARC etching process, an antireflection coating 5' remains under the photoresist mask 6, as illustrated in FIG. 7B. In the polysilicon etching process, as in the BARC etching process, the polysilicon film 4 in an area not covered with the photoresist mask 6 and the antireflection coating 5' is removed. After the polysilicon etching process, as illustrated in FIG. 7C, a gate electrode 7 is formed on the silicon dioxide film 3 under the photoresist mask 6 and the antireflection coating 5'.

The gate width 9 of the gate electrode 7 has a large influence on the performance of an electronic device and is therefore strictly controlled as the most critical dimension (CD). A value calculated by subtracting the width of a mask before etching from the width of a film after etching is referred to as "CD shift." The CD shift is an important indicator to determine the quality of etching. Thus, a target CD shift is defined before etching. In the BARC etching process, the CD shift is calculated by subtracting the width 8 of the photoresist mask 6 from the width 8' of the antireflection coating 5. Similarly, in the polysilicon etching process, the CD shift is calculated by subtracting the width 8' of the antireflection coating 5 from the gate width 9. The CD shift of the gate etching is calculated by subtracting the width 8 of the photoresist mask 6 from the gate width 9.

Figure 8:
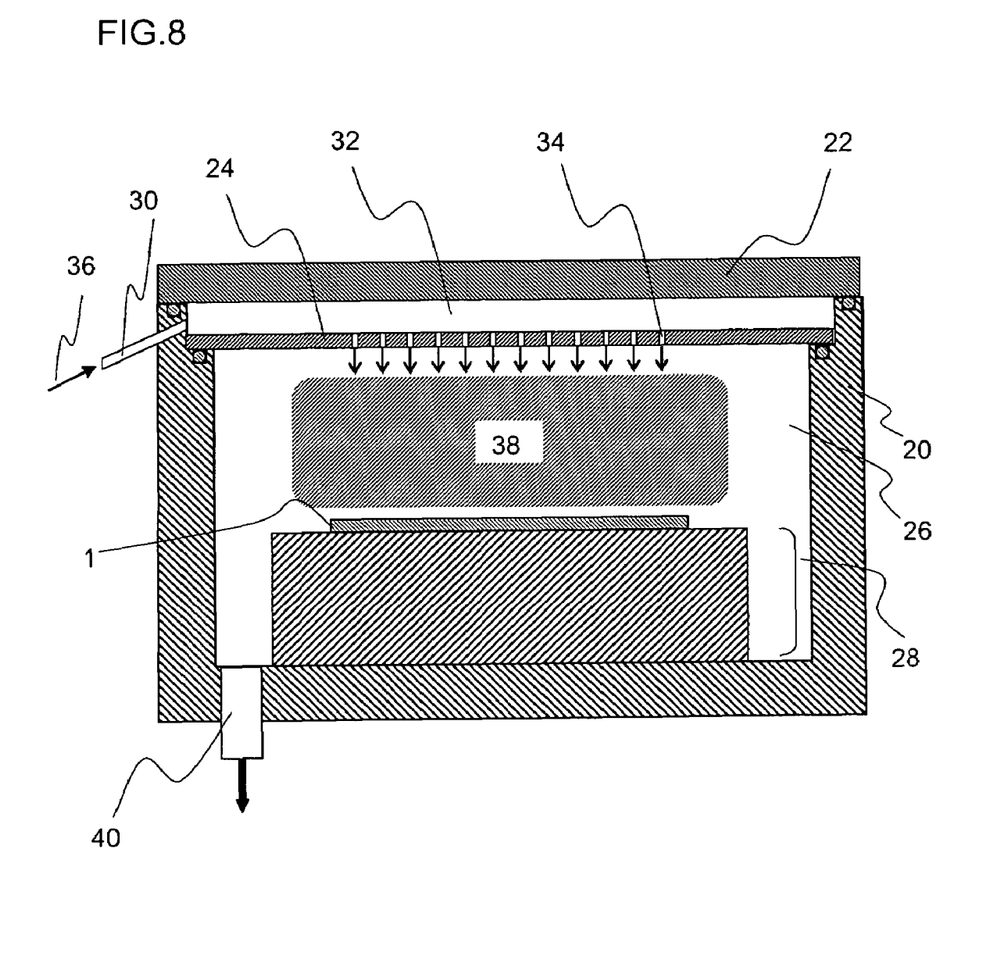
FIG. 8 is a sectional side view of a processing chamber of a conventional plasma etching apparatus.

A conventional plasma etching apparatus for the gate etching is described below with reference to FIG. 8. The conventional plasma etching apparatus includes a processing chamber 26 composed of a processing chamber lid 22 and a showerhead plate 24 on a processing chamber wall 20, and a specimen holder 28 in the processing chamber 26. A specimen 1 is placed on the specimen holder 28. A processing gas 36 is introduced into a space 32 between the processing chamber lid 22 and the showerhead plate 24 through an inlet 30 provided in the upper portion of the processing chamber wall 20. The processing gas 36 is then introduced into the processing chamber 26 through a lot of gas inlet holes 34 provided in the showerhead plate 24 and generates plasma 38. A plasma etching process is performed by exposing the specimen 1 to the plasma 38. The processing gas 36 and volatile substances produced during plasma etching are eliminated from an exhaust port 40. The exhaust port 40 is connected to a vacuum pump (not shown). The internal pressure of the processing chamber 26 is reduced to about 0.5 to about 1 Pa with the vacuum pump.

While the gate etching is performed with such a plasma etching apparatus, an increase in the size of the specimen 1 makes it difficult to achieve in-plane uniformity of the etch rate over a wider area of the specimen 1, the CD shift of the gate etching, and the shape of the gate electrode 7. Furthermore, recent finer design of a semiconductor device requires stricter control of the CD shift.

Deposition of a reaction product on the sidewall of a gate electrode is described below as a factor having an influence on the CD shift. Conventionally, a gas mixture, for example, of chlorine ($Cl_2$), hydrogen bromide (HBr), and oxygen ($O_2$) has been used in the gate etching. These gases are present in a plasma state during etching, serving as etchants for the polysilicon film 4. During etching, chlorine (Cl), hydrogen (H), bromine (Br), and oxygen (O) ions or radicals generated by the dissociation of chlorine, hydrogen bromide, and oxygen molecules in the processing gas 36 react with silicon from the polysilicon film 4 to produce reaction products. The ions are attracted to the specimen 1 owing to a high-frequency wave applied to the specimen 1 and perform anisotropic etching, thus providing a gate having a vertically well-defined desired shape. Although volatile substances in the resulting reaction products are eliminated from the exhaust port 40, nonvolatile substances are deposited on the polysilicon film 4 or the photoresist mask 6. Among the nonvolatile substances, nonvolatile reaction products deposited on the sidewall of the gate electrode 7 act as a protective film of the sidewall against etching by an etchant radical, such as chlorine. Thus, when a small amount of nonvolatile reaction products are deposited on the sidewall of the gate electrode 7, isotropic etching due to radicals often proceeds on the sidewall of the gate electrode 7, decreasing the gate width 9 after etching. On the other hand, when a large amount of nonvolatile reaction products are deposited on the sidewall of the gate electrode 7, the gate width 9 after etching often increases because they act as an etching mask.

Accordingly, the concentration of reaction products has a large influence on the gate width 9. A nonuniform distribution of reaction products in the vicinity of the surface of the specimen 1 may cause in-plane nonuniformity of the CD shift of the specimen 1. For example, while a central portion of the specimen 1 has silicon to be etched around the central portion, the perimeter of the specimen 1 has no silicon to be etched outside the perimeter. Thus, even when the etch rate is uniform on surface of the specimen 1, the concentration of reaction products containing silicon derived from the polysilicon film 4 is high in the central portion and low in an outer portion. This can also cause in-plane nonuniformity of the CD shift.

Furthermore, in-plane nonuniformity of an etchant, such as a chlorine radical or ion or a bromine radical or ion, in the vicinity of the surface of the specimen can cause in-plane nonuniformity of the etch rate, which can in turn cause in-plane nonuniformity of the CD shift. In addition, when a silicon-based reaction product produced in etching using chlorine or bromine is chemically combined with oxygen, the product is more easily deposited on the sidewall of the gate electrode 7. Thus, in-plane nonuniformity of the oxygen content may cause in-plane nonuniformity of the CD shift. Similarly, when a processing gas containing carbon, such as carbon tetrafluoride ($CF_4$), is used, the resulting carbonaceous reaction product is more easily deposited on the sidewall of the gate electrode 7. Thus, in-plane nonuniformity of the concentration of the carbonaceous reaction product may cause in-plane nonuniformity of the CD shift.

As described above, nonuniform distribution of a reaction product or an etchant on the surface of the specimen 1 may cause in-plane nonuniformity of the CD shift. To improve in-plane uniformity of the CD shift, the inventors have focused attention on the importance of controlling the distribution of a reaction product in the vicinity of the surface of a specimen and the composition of a processing gas. Thus, the inventors proposed a technique in which gases having different compositions are introduced from a plurality of gas inlets (see, for example, Japanese Unexamined Patent Application Publication No. 2005-056914). However, this technique does not refer to individual control in a plurality of etching steps constituting the etching process. Furthermore, this technique is insufficient to reduce nonuniformity of the CD shift caused by variations in the surface density.

The amount of reaction product deposited on the sidewall of the polysilicon film 4 (that is, the side wall of the gate electrode 7 during etching), which is one of factors having an influence on the gate width 9, varies with the temperature of the specimen 1 during etching. This is because the sticking coefficient of a reaction product to the sidewall of the gate electrode 7 increases with decreasing temperature. Thus, the temperature distribution on the surface of the specimen 1 has an influence on the in-plane distribution of the CD shift. Japanese Patent Application No. 2005-028804 discloses a technique in which in-plane uniformity of the gate width 9 is improved by controlling the surface temperature distribution of the holder 28 of the specimen 1 to control the in-plane temperature distribution of the specimen 1. Thus, this technique can improve the in-plane uniformity of the gate width 9. However, there is a demand for a further improvement in uniformity of the CD shift caused by variations in the surface density.

The following is a description of nonuniformity of the CD shift caused by variations in the surface density. The photoresist mask 6 is not always uniformly formed on the surface of the specimen 1. For example, components of the photoresist mask 6 are close to each other in some portion. In other words, the photoresist mask 6 is formed densely in some portion (hereinafter referred to as dense portion). In contrast, components of the photoresist mask 6 are far from each other in another portion. In other words, the photoresist mask 6 is formed sparsely in another portion (hereinafter referred to as nondense portion). The amount of polysilicon to be etched is smaller in the dense portion than in the nondense portion. Thus, in the dense portion, a smaller amount of reaction product containing silicon derived from the polysilicon film 4 is produced; therefore a smaller amount of reaction product is deposited on the sidewall of the gate electrode 7. Hence, even when the nondense portion has the same photoresist mask width 8 as the dense portion, the nondense portion may have a larger CD shift and a larger gate width 9 than the dense portion. However, when the distance between adjacent components of the photoresist mask 6 is very small in the dense portion, the amount of radical etchant entering the space between the adjacent components is smaller than that in the nondense portion. Thus, the dense portion may have a larger CD shift than the nondense portion. Furthermore, when a processing gas has a high deposition power, the amount of deposits on the sidewall of the gate electrode 7 resulting from the processing gas is smaller in the dense portion. Thus, the dense portion may have a smaller CD shift than the nondense portion. The variations in the surface density also reduce in-plane uniformity of the CD shift and should therefore be decreased.

In general, a specimen composed of a plurality of films needs a plurality of etching steps and nonoperating steps between the etching steps. In nonoperating steps, plasma discharge is stopped to eliminate a processing gas. This is because the etching conditions vary greatly with the film type. Thus, the target CD shift cannot be achieved by a continuous plasma discharge throughout the steps. However, the nonoperating steps decrease the throughput.

SUMMARY OF THE INVENTION

Accordingly, it is a first object of the present invention to provide a plasma etching apparatus that can perform etching with excellent in-plane uniformity and that can reduce the nonuniformity of the CD shift caused by variations in the surface density and to provide a plasma etching method using the plasma etching apparatus.

It is a second object of the present invention to provide a plasma etching apparatus that can perform etching with excellent in-plane uniformity and a high throughput and to provide a plasma etching method using the plasma etching apparatus.

The problems of the conventional technologies described above will be overcome by the present invention. The present invention provides a plasma etching apparatus that includes means for introducing a plurality of processing gases having different compositions (flow ratio of processing gas components) and different flow rates into a processing chamber from respective gas inlets using a plurality of gas supply units and a flow rate controller for controlling the flow rates of a plurality of gases, and means for controlling the in-plane temperature distribution of a specimen holder, wherein the compositions (flow ratio of processing gas components) and the flow rates of the processing gases and the in-plane temperature distribution of the specimen holder are independently controlled.

The problems of the conventional technologies described above will be overcome by independently controlling the flow rates and the compositions of different processing gases introduced into a processing chamber from different gas inlets and the in-plane temperature distribution of a specimen holder in each of a plurality of steps constituting a plasma etching process.

DESCRIPTION OF THE PREFERRED EMBODIMENTS

A plasma etching apparatus according to the present invention includes a processing chamber in which a specimen is subjected to plasma processing, a specimen holder for holding the specimen, the specimen holder including a temperature controller for controlling temperatures at at least 2 positions of the specimen, at least two gas supply sources for supplying processing gases, at least two gas inlets for introducing the processing gases into the processing chamber, an electromagnetic wave supply unit for sending an electromagnetic wave into the processing chamber, and a regulator for independently controlling the compositions and the flow rates of the processing gases supplied to the at least two gas inlets.

In one aspect of the present invention, the at least two gas inlets are disposed in substantially the same plane, and the processing gases having different compositions or flow rates are introduced from the at least two gas inlets. In another aspect of the present invention, the regulator independently controls the compositions or the flow rates of the processing gases introduced from the at least two gas inlets and the temperatures controlled with at least two temperature controllers provided in the specimen holder.

The present invention provides a plasma etching method using a plasma etching apparatus, the plasma etching apparatus comprising a processing chamber in which a specimen is subjected to plasma processing, a specimen holder for holding the specimen, the specimen holder including a temperature controller for controlling temperatures at at least 2 positions of the specimen, at least two gas supply sources for supplying processing gases, at least two gas inlets for introducing the processing gases into the processing chamber, a regulator for independently controlling the compositions or the flow rates of the processing gases introduced from the at least two gas inlets and the temperatures controlled with at least two temperature controllers provided in the specimen holder, and an electromagnetic wave supply unit for sending an electromagnetic wave into the processing chamber, wherein the compositions or the flow rates of the processing gases introduced from the at least two gas inlets and the temperatures controlled with the at least two temperature controllers provided in the specimen holder are independently controlled.

In one aspect of the present invention, plasma etching is performed in a plurality of etching steps. In another aspect of the present invention, the compositions or the flow rates of the processing gases introduced from the at least two gas inlets and the temperatures controlled with at least two temperature controllers provided in the specimen holder are independently controlled, and plasma discharge is continued through a plurality of etching steps.

Embodiment 1 of the present invention is described in detail below with reference to FIGS. 1 to 4.

Embodiment 1

Figure 1:
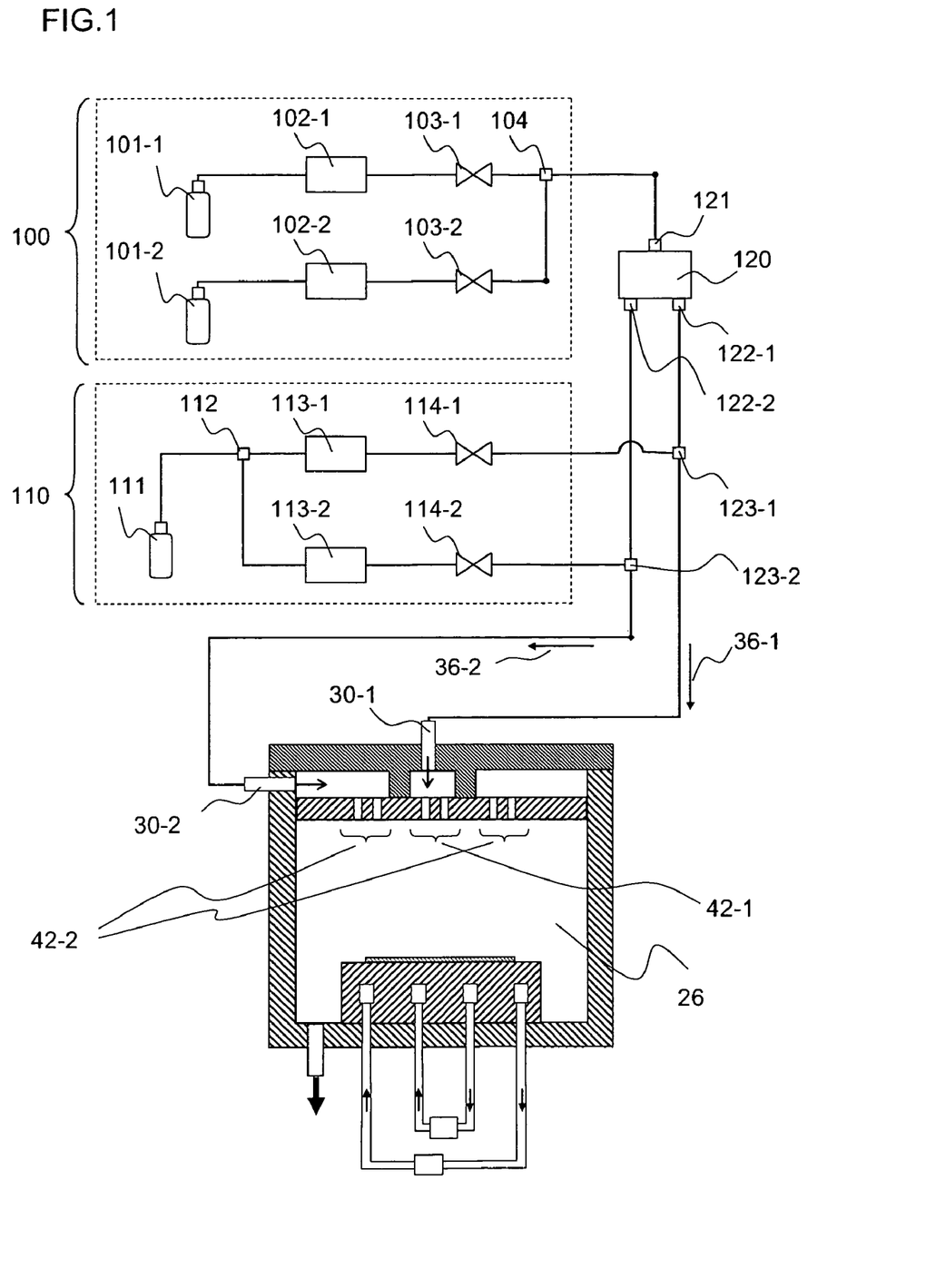
FIG. 1 is a schematic view of an etching apparatus and a gas system of the etching apparatus according to Embodiments 1 to 3 of the present invention.

FIG. 1 is a schematic view of a UHF-ECR plasma etching apparatus and a gas system of the etching apparatus according to Embodiment 1 of the present invention. The gas system includes a common gas system 100 and an additive gas system 110. The common gas system 100 includes gas supply units 101-1 and 101-2, which serve as gas supply sources, flow controllers 102-1 and 102-2 for controlling the flow rates of respective gases, valves 103-1 and 103-2 for controlling respective gas flows, and a confluence 104 where the gases in the common gas system 100 join into one. In the present embodiment, the gas supply unit 101-1 contains hydrogen bromide (HBr) and the gas supply unit 101-2 contains chlorine ($Cl_2$) as common gases.

The mixed common gas in the confluence 104 enters a downstream gas flow divider 120. The gas flow divider 120 divides a gas flowing through an inlet 121 into a plurality of (two in the present embodiment) gases flowing through outlets 122-1 and 122-2 at any flow ratio.

The additive gas system 110 includes a gas supply unit 111, a branch 112 for dividing a gas into a plurality of (two in the present embodiment) gases, flow controllers 113-1 and 113-2 for controlling the flow rates of respective divided gases, and valves 114-1 and 114-2 for controlling respective gas flows. In the present embodiment, the gas supply unit 111 contains oxygen ($O_2$) as an additive gas.

The mixed common gas (a gas mixture of hydrogen bromide and chlorine in the present embodiment) from the outlet 122-1 of the gas flow divider 120 merges with an additive gas (oxygen in the present embodiment) from the valve 114-1 at a confluence 123-1. A gas mixture of the mixed common gas and the additive gas (hereinafter referred to as first processing gas 36-1) enters a first gas inlet pipe 30-1.

In the same manner, the mixed common gas (a gas mixture of hydrogen bromide and chlorine in the present embodiment) from the outlet 122-2 of the gas flow divider 120 merges with an additive gas (oxygen in the present embodiment) from the valve 114-2 at a confluence 123-2. A gas mixture of the mixed common gas and the additive gas (hereinafter referred to as second processing gas 36-2) enters a second gas inlet pipe 30-2.

The gas system allows the introduction of processing gases having different compositions and flow rates into a processing chamber 26.

Figure 2:
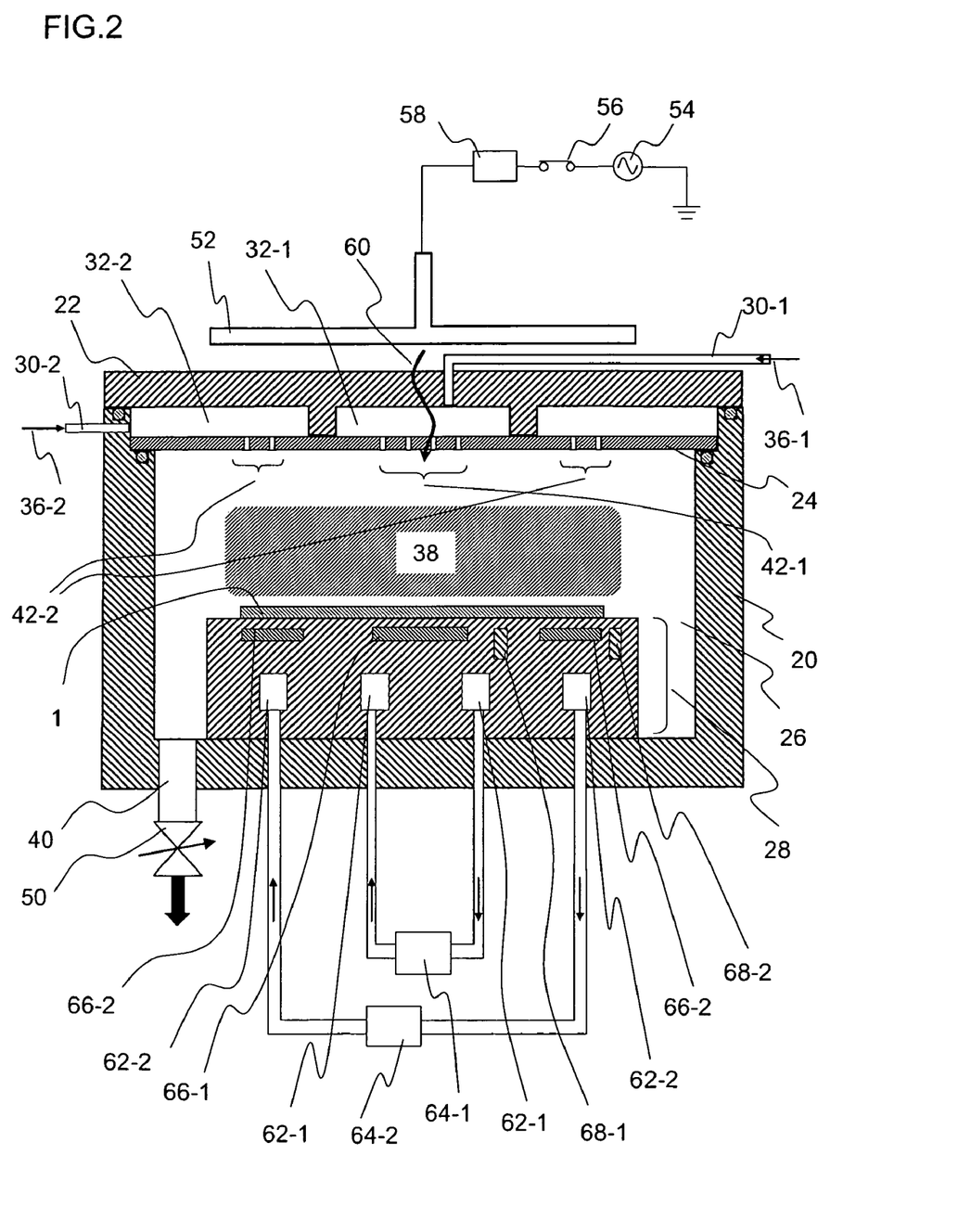
FIG. 2 is a sectional side view of a processing chamber of the etching apparatus according to Embodiments 1 to 3 of the present invention.

Then, the structure of the processing chamber 26 is described in detail with reference to FIG. 2. The processing chamber 26 includes a processing chamber wall 20, a processing chamber lid 22 formed of an insulator (quartz glass in the present embodiment), and a specimen holder 28 for holding a specimen 1 thereon. The first processing gas 36-1 flowing through the first gas inlet pipe 30-1 from the gas system illustrated in FIG. 1 enters a central space 32-1 between the processing chamber lid 22 and a quartz showerhead plate 24. A central gas inlet region 42-1 having a plurality of gas inlet holes is disposed in the vicinity of the center of the showerhead plate 24 and faces the specimen 1. The first processing gas 36-1 is introduced into the processing chamber 26 through the central gas inlet region 42-1. In the same manner, the second processing gas 36-2 flowing through the second gas inlet pipe 30-2 enters a space 32-2 between the processing chamber lid 22 and the showerhead plate 24. The showerhead plate 24 facing the specimen 1 includes an outer gas inlet region 42-2 outside the central gas inlet region 42-1. The outer gas inlet region 42-2 has a plurality of gas inlet holes, through which the second processing gas 36-2 is introduced into the processing chamber 26.

The processing chamber 26 includes the specimen holder 28, on which the specimen 1 is held. The specimen holder 28 includes an adsorption electrode (not shown) therein. A direct-current voltage applied to the adsorption electrode generates an electrostatic force between the adsorption electrode and the specimen 1, thereby adsorbing the specimen 1 on the specimen holder 28.

An antenna 52 is disposed over the processing chamber lid 22. A high-frequency wave (UHF in the present embodiment) from a high-frequency power source 54 is applied to the antenna 52 through a switch 56 and a matching transformer 58, generating an electromagnetic wave 60 in the processing chamber 26. A coil (not shown) disposed around the processing chamber wall 20 generates a magnetic field. The electron cyclotron resonance (ECR) between the electromagnetic wave 60 and the magnetic field causes high-density plasma 38.

Plasma etching is performed by exposing the specimen 1 to the plasma 38. The specimen holder 28 includes a high-frequency electrode (not shown) therein. The application of a high-frequency voltage to the high-frequency electrode generates a bias potential, which attracts ions produced in the plasma 38 to the specimen 1, thus performing anisotropic etching.

The processing gas 36 and volatile substances produced during plasma etching are eliminated from an exhaust port 40. The exhaust port 40 is connected to a vacuum pump (not shown). The internal pressure of the processing chamber 26 is reduced to about 1 Pa with the vacuum pump. A pressure control valve 50 is disposed between the exhaust port 40 and the vacuum pump. The internal pressure of the processing chamber 26 is controlled by regulating the degree of opening of the pressure control valve 50.

The specimen 1 is heated by the radiation of the plasma 38 or ions generated in the plasma 38. The heat is removed by a refrigerant circulating in the specimen holder 28. In the present embodiment, refrigerants having different temperatures are circulated through an inner refrigerant passage 62-1 and an outer refrigerant passage 62-2 in the specimen holder 28 so that the specimen 1 has a radial temperature distribution. In the present embodiment, a liquid fluorocarbon polymer usable at a temperature of −30° C. to 110° C. is used as a refrigerant. The refrigerants having desired temperatures are circulated through the respective refrigerant passages to control the temperatures in the vicinities of the passages at −30° C. to 110° C. To this end, the inner refrigerant passage 62-1 is connected to an inner circulator 64-1, and the outer refrigerant passage 62-2 is connected to an outer circulator 64-2. The set temperatures of these circulators are altered so that the specimen holder 28 has a radial temperature distribution. Thus, the specimen 1 can have a radial temperature distribution.

The specimen holder 28 also includes an inner heater 66-1 and an outer heater 66-2, which are connected to respective power supplies (not shown). The electric power applied to each heater is controlled so that the specimen holder 28 has a radial temperature distribution. Thus, the specimen 1 can have a radial temperature distribution. A space, which serves as a heat-insulating layer (not shown), is provided between the inner refrigerant passage 62-1 and the outer refrigerant passage 62-2. The heat-insulating layer thermally separates the inner refrigerant passage 62-1 and the outer refrigerant passage 62-2, and the inner heater 66-1 and the outer heater 66-2. Thus, the specimen 1 can easily have a temperature distribution between the inner portion and the outer portion. In the absence of the heat-insulating layer, the inner heater 66-1 and the outer heater 66-2 practically need a capacity of 600 to 700 W. By contrast, in the presence of the heat-insulating layer, the capacity can be reduced to 200 to 300 W. This reduces the sizes of the heaters. Furthermore, a helium (He) gas is introduced between the specimen 1 and the holding surface of the specimen holder 28 through a heat-transfer gas inlet pipe (not shown) provided in the specimen holder 28. The helium gas enhances the heat transfer between the specimen 1 and the specimen holder 28.

The specimen holder 28 further includes an inner thermometer 68-1 and an outer thermometer 68-2 therein, which measure the temperatures at the inner portion and the outer portion of the specimen holder 28, respectively. Thus, the temperature of the specimen 1 can be determined at the inner portion and the outer portion. This method practically present no problem when the inner thermometer 68-1 and the outer thermometer 68-2 are previously calibrated for the temperatures at the center portion and the outer portion of the specimen 1, although direct measurement of the temperatures at the center portion and the outer portion of the specimen 1 increases the accuracy.

The plasma etching apparatus according to the present invention includes a regulator (not shown) for independently controlling the compositions or the flow rates of the processing gases supplied to the at least two gas inlets.

In one aspect of the present invention, the regulator independently controls the compositions or the flow rates of the processing gases introduced from the at least two gas inlets and the temperatures controlled with at least two temperature controllers provided in the specimen holder. The regulator independently controls the flow controllers 102-1, 102-2, 113-1, and 113-2 and valves 103-1, 103-2, 114-1, and 114-2. The regulator independently controls the inner circulator 64-1, the outer circulator 64-2, the inner heater 66-1, and the outer heater 66-2 on the basis of the temperatures measured by the inner thermometer 68-1 and the outer thermometer 68-2.

Figure 3A:
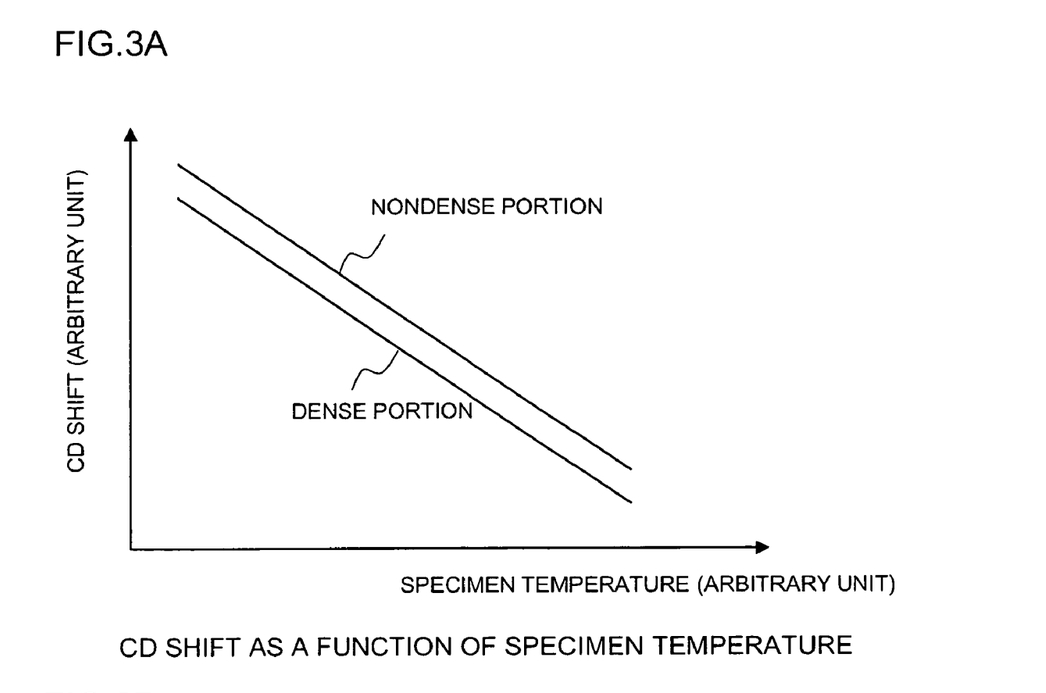
FIG. 3A is a graph illustrating the CD shift as a function of the temperature of a specimen.
Figure 3B:
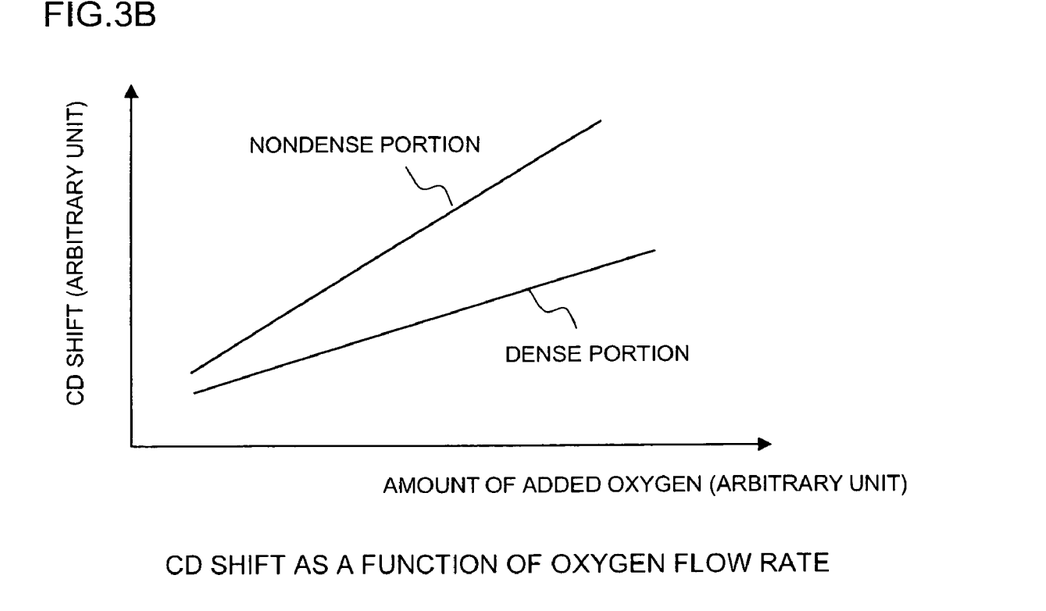
FIG. 3B is a graph illustrating the CD shift as a function of the oxygen flow rate.

A plasma etching method using the plasma etching apparatus described above is described specifically for gate etching with reference to FIGS. 3 and 4. As described above, the CD shift is sensitive to the amount of reaction product deposited on the sidewall of the gate electrode 7, which is in turn sensitive to the temperature of the specimen 1 and the concentrations of a reaction product, an etchant, and oxygen. The sensitivity, however, are different between the nondense portion and the dense portion. Under an etching condition using hydrogen bromide, chlorine, and oxygen, the CD shift decreases with an increase in the temperature of the specimen 1 in both the nondense portion and the dense portion, as illustrated in FIG. 3A. This is because the sticking coefficient of a reaction product to the sidewall of the gate electrode 7 decreases with an increase in the temperature of the specimen 1 and thereby the deposit decreases. This experiment demonstrated that the effect of the temperature of the specimen 1 on the CD shift is almost the same between the nondense portion and the dense portion. In contrast, the effect of the amount of added oxygen on the CD shift is larger in the nondense portion than in the dense portion, as illustrated in FIG. 3B. This is partly because a greater amount of silicon to be etched in the nondense portion increases the amount of reaction product that has a higher deposition power when combined with an oxygen radical, as compared with the dense portion. This is also because a narrower space between adjacent gate electrodes 7 in the dense portion decreases the number of oxygen radicals entering the space. The following is a description of a method for reducing the nonuniformity of the CD shift caused by variations in the surface density utilizing these different effects in the nondense portion and the dense portion.

Figure 4A:
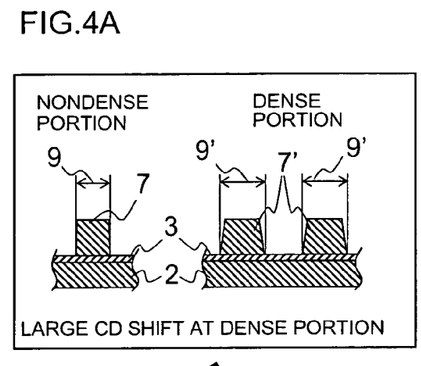
FIGS. 4A to 4E are schematic views illustrating a technique for controlling nonuniformity of the CD shift caused by variations in the surface density according to Embodiment 1 of the present invention.

As illustrated in FIG. 4A, when the CD shift of the nondense portion is equal to or smaller than a target value and the CD shift of the dense portion is larger than the target value, it is appropriate to increase the temperature of the specimen 1 and increase the amount of added oxygen. For example, it is appropriate to increase the temperature of the specimen 1 by 4° C. and increase the amount of added oxygen by 2 sccm. "2 sccm" stands for a flow rate of 2 cc/min at standard conditions. Thus, in the nondense portion, a decrease in the sticking coefficient of a reaction product due to the increase in the temperature of the specimen 1 is canceled out by an increase in the amount of deposited reaction product due to the increase in the amount of added oxygen. Thus, the CD shift remains almost unchanged. In the dense portion, while a decrease in the sticking coefficient of a reaction product due to the increase in the temperature of the specimen 1 is remarkable as in the nondense portion, an increase in the amount of deposited reaction product due to the increase in the amount of added oxygen is smaller than that in the nondense portion. This decreases the CD shift of the dense portion. Thus, the nonuniformity of the CD shift caused by variations in the surface density can be decreased. Thus, the CD shifts of both the nondense portion and the dense portion can approach the target value, as illustrated in FIG. 4E.

Figure 4B:
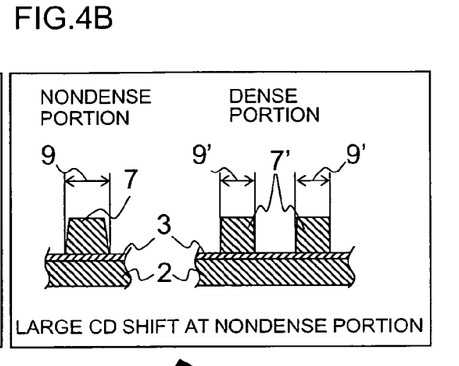

As illustrated in FIG. 4B, when the CD shift of the dense portion is equal to or smaller than the target value and the CD shift of the nondense portion is larger than the target value, it is appropriate to decrease the amount of added oxygen while the temperature of the specimen 1 is kept unchanged. For example, it is appropriate to decrease the amount of added oxygen by 2 sccm. In the nondense portion, since the temperature of the specimen 1 remains unchanged, the sticking coefficient of a reaction product also remains unchanged. However, the decrease in the amount of added oxygen results in a decrease in the amount of deposited reaction product, thus decreasing the CD shift. In the dense portion, since the temperature of the specimen 1 remains unchanged, the sticking coefficient of a reaction product also remains unchanged as in the nondense portion. A decrease in the amount of deposited reaction product due to the reduction in the amount of added oxygen is smaller in the dense portion than in the nondense portion. Thus, the CD shift remains almost unchanged and is equal to or smaller than the target value. When a decrease in the amount of deposited reaction product due to the reduction in the amount of added oxygen has a certain effect in the dense portion, it is appropriate to decrease the temperature of the specimen 1 slightly and decrease the amount of added oxygen. For example, it is appropriate to decrease the temperature of the specimen 1 by 1° C. and decrease the amount of added oxygen by 3 sccm. In this case, in the nondense portion, a slight decrease in the temperature of the specimen 1 slightly increases the sticking coefficient of a reaction product. However, the effect of the decrease in the amount of deposited reaction product due to the decrease in the amount of added oxygen is larger than the temperature effect. Thus, the CD shift decreases in the nondense portion. In the dense portion, a slight increase in the sticking coefficient of a reaction product due to the slight decrease in the temperature of the specimen 1 is canceled out by a slight decrease in the amount of deposited reaction product due to the reduction in the amount of added oxygen. Thus, the CD shift remains almost unchanged and is equal to or smaller than the target value. Thus, the CD shifts of both the nondense portion and the dense portion can approach the target value, as illustrated in FIG. 4E.

Figure 4C:
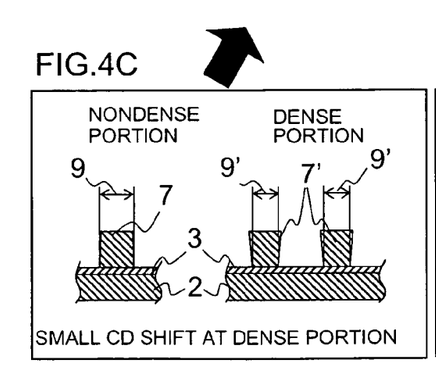

As illustrated in FIG. 4C, when the CD shift of the nondense portion is equal to or smaller than the target value and the CD shift of the dense portion is smaller than the target value, it is appropriate to decrease the temperature of the specimen 1 and decrease the amount of added oxygen. For example, it is appropriate to decrease the temperature of the specimen 1 by 4° C. and decrease the amount of added oxygen by 2 sccm. Thus, in the nondense portion, an increase in the sticking coefficient of a reaction product due to the decrease in the temperature is canceled out by a decrease in the amount of deposited reaction product due to the decrease in the amount of added oxygen. Thus, the CD shift remains almost unchanged. In the dense portion, while an increase in the sticking coefficient of a reaction product due to the decrease in the temperature of the specimen 1 is remarkable as in the nondense portion, a decrease in the amount of deposited reaction product due to the decrease in the amount of added oxygen is smaller than that in the nondense portion. Thus, the nonuniformity of the CD shift caused by variations in the surface density can be decreased. Thus, the CD shifts of both the nondense portion and the dense portion can approach the target value, as illustrated in FIG. 4E.

Figure 4D:
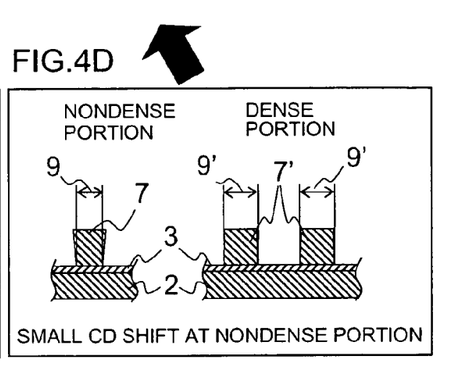
Figure 4E:
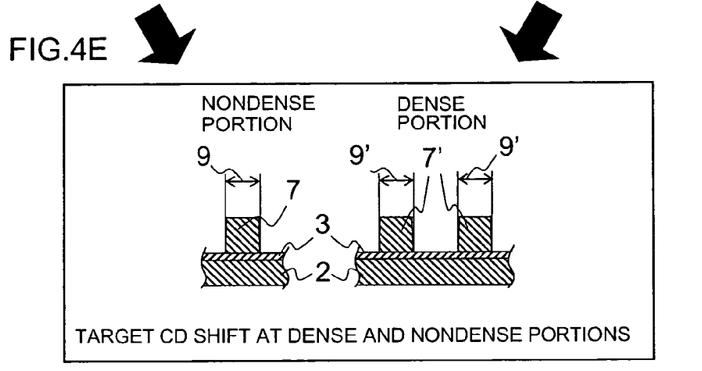

As illustrated in FIG. 4D, when the CD shift of the dense portion is equal to or smaller than the target value and the CD shift of the nondense portion is smaller than the target value, it is appropriate to increase the amount of added oxygen while the temperature of the specimen 1 is kept unchanged. For example, it is appropriate to increase the amount of added oxygen by 2 sccm. In the nondense portion, since the temperature of the specimen 1 remains unchanged, the sticking coefficient of a reaction product also remains unchanged. However, the increase in the amount of added oxygen results in an increase in the amount of deposited reaction product, thus increasing the CD shift. In the dense portion, since the temperature of the specimen 1 remains unchanged, the sticking coefficient of a reaction product also remains unchanged as in the nondense portion. An increase in the amount of deposited reaction product due to the increase in the amount of added oxygen is smaller in the dense portion than in the nondense portion. Thus, the CD shift remains almost unchanged and is equal to or smaller than the target value. When an increase in the amount of deposited reaction product due to the increase in the amount of added oxygen has a certain effect in the dense portion, it is appropriate to increase the temperature of the specimen 1 slightly and increase the amount of added oxygen. For example, it is appropriate to increase the temperature of the specimen 1 by 1° C. and increase the amount of added oxygen by 3 sccm. In this case, in the nondense portion, a slight increase in the temperature of the specimen 1 slightly decreases the sticking coefficient of a reaction product. However, the effect of the increase in the amount of deposited reaction product due to the increase in the amount of added oxygen is larger than the temperature effect. Thus, the CD shift increases in the nondense portion. In the dense portion, a slight decrease in the sticking coefficient of a reaction product due to the slight increase in the temperature of the specimen 1 is canceled out by a slight increase in the amount of deposited reaction product due to the increase in the amount of added oxygen. Thus, the CD shift remains almost unchanged and is equal to or smaller than the target value. Thus, the CD shifts of both the nondense portion and the dense portion can approach the target value, as illustrated in FIG. 4E.

In the foregoing description, the amount of added oxygen is increased to increase the amount of deposited reaction product. This is because a silicon-based reaction product produced during etching is more easily deposited on the sidewall of the gate electrode 7 when combined with oxygen. However, means for increasing the deposit on the sidewall of the gate electrode 7 is not limited to this. For example, a carbonaceous reaction product having a high deposition power produced from a processing gas containing carbon, such as carbon tetrafluoride ($CF_4$), may be deposited on the sidewall of the gate electrode 7. In this case, the deposit on the sidewall of the gate electrode 7 can be increased by increasing the processing gas containing carbon.

The control technique utilizing the temperature control of the specimen 1 and the flow rate control of a processing gas can also be applied independently to the inner portion and the outer portion of the specimen 1. This decreases the difference in the CD shifts of the nondense portion and the dense portion, thus reducing in-plane nonuniformity of the CD shift.

For example, when the CD shift is equal to or smaller than a target value in the nondense portion but is larger than the target value in the dense portion in the inner portion of the specimen 1, and when the CD shifts of the nondense portion and the dense portion are equal to or less than the target value in the outer portion of the specimen 1, it is appropriate to increase the temperature and the oxygen content of the inner portion of the specimen 1 and keep the temperature and the oxygen content unchanged in the outer portion of the specimen 1. In this case, it is appropriate to increase the set temperature of the inner circulator 64-1 or the amount of heat generated by the inner heater 66-1, increase the oxygen content of the first processing gas 36-1, and keep the set temperature of the outer circulator 64-2 or the amount of heat generated by the outer heater 66-2 and the oxygen content of the second processing gas 36-2 unchanged in FIG. 2. If desired, the fine adjustments as described above with reference to FIG. 4A can be made to the inner portion of the specimen 1. This allows precise control of the CD shifts of the nondense portion and the dense portion in the inner portion of the specimen 1.

For a specimen 1 formed of silicon, which has a high thermal conductivity of 148 W/(m·K), an increase in the temperature of the inner portion of the specimen 1 may cause an increase in the temperature of the outer portion. In such a case, to compensate for the increase in the temperature of the outer portion of the specimen 1, it is appropriate to decrease the set temperature of the outer circulator 64-2 or the amount of heat generated by the outer heater 66-2. Similarly, an increase in the oxygen content of the first processing gas 36-1 may cause an increase in the oxygen content of the outer portion of the specimen 1 because of the flow or diffusion of the processing gas. In such a case, to compensate for the increase in the oxygen content of the outer portion of the specimen 1, it is appropriate to decrease the oxygen content of the second processing gas 36-2. This allows the CD shift in the dense portion in the inner portion of the specimen 1 to approach the target value while the CD shifts of the nondense portion and the dense portion in the outer portion of the specimen 1 and the CD shift in the nondense portion in the inner portion are kept equal to or smaller than the target value. Thus, the nonuniformity of the CD shift caused by variations in the surface density can be reduced.

When the CD shifts of the nondense portion and the dense portion in the inner portion of the specimen 1 are equal to or smaller than the target value, and when the CD shift is equal to or smaller than the target value in the nondense portion but is larger than the target value in the dense portion in the outer portion of the specimen 1, it is appropriate to increase the temperature and the oxygen content of the outer portion while the temperature and the oxygen content of the inner portion of the specimen 1 are kept unchanged. In this case, it is appropriate to increase the set temperature of the outer circulator 64-2 or the amount of heat generated by the outer heater 66-2 and increase the oxygen content of the second processing gas 36-2 while the set temperature of the inner circulator 64-1 or the amount of heat generated by the inner heater 66-1 and the oxygen content of the first processing gas 36-1 are kept unchanged in FIG. 2. If desired, the fine adjustments as described above with reference to FIG. 4A can be made to the outer portion of the specimen 1. This allows precise control of the CD shifts of the nondense portion and the dense portion in the outer portion of the specimen 1. An increase in the temperature of the outer portion of the specimen 1 may cause an increase in the temperature of the inner portion. In such a case, to compensate for the increase in the temperature of the inner portion of the specimen 1, it is appropriate to decrease the set temperature of the inner circulator 64-1 or the amount of heat generated by the inner heater 66-1. Similarly, an increase in the oxygen content of the second processing gas 36-2 may cause an increase in the oxygen content of the inner portion of the specimen 1. In such a case, to compensate for the increase in the oxygen content of the inner portion of the specimen 1, it is appropriate to decrease the oxygen content of the first processing gas 36-1. This allows the CD shift in the dense portion in the outer portion of the specimen 1 to approach the target value while the CD shifts of the nondense portion and the dense portion in the inner portion of the specimen 1 and the CD shift in the nondense portion in the outer portion are kept equal to or smaller than the target value. Thus, the nonuniformity of the CD shift caused by variations in the surface density can be reduced.

When the CD shift is larger than the target value in the nondense portion but is equal to or smaller than the target value in the dense portion in the inner portion of the specimen 1, and when the CD shifts of the nondense portion and the dense portion are equal to or smaller than the target value in the outer portion of the specimen 1, it is appropriate to decrease the oxygen content of the inner portion of the specimen 1 while the temperature of the inner portion of the specimen 1 and the temperature and the oxygen content of the outer portion of the specimen 1 are kept unchanged. In this case, it is appropriate to decrease the oxygen content of the first processing gas 36-1 while the set temperature of the inner circulator 64-1 or the amount of heat generated by the inner heater 66-1, the set temperature of the outer circulator 64-2 or the amount of heat generated by the outer heater 66-2, and the oxygen content of the second processing gas 36-2 are kept unchanged in FIG. 2. If desired, the fine adjustments as described above with reference to FIG. 4B can be made to the inner portion of the specimen 1. This allows precise control of the CD shifts of the nondense portion and the dense portion in the inner portion of the specimen 1. A decrease in the oxygen content of the first processing gas 36-1 may cause a decrease in the oxygen content of the outer portion of the specimen 1. In such a case, to compensate for the decrease in the oxygen content of the outer portion of the specimen 1, it is appropriate to increase the oxygen content of the second processing gas 36-2. This allows the CD shift in the nondense portion in the inner portion of the specimen 1 to approach the target value while the CD shifts of the nondense portion and the dense portion in the outer portion of the specimen 1 and the CD shift in the dense portion in the inner portion are kept equal to or smaller than the target value. Thus, the nonuniformity of the CD shift caused by variations in the surface density can be reduced.

When the CD shifts of the nondense portion and the dense portion in the inner portion of the specimen 1 are equal to or smaller than the target value, and when the CD shift is larger than the target value in the nondense portion but is equal to or smaller than the target value in the dense portion in the outer portion of the specimen 1, it is appropriate to decrease the oxygen content of the outer portion while the temperature and the oxygen content of the inner portion of the specimen 1 and the temperature of the outer portion of the specimen 1 are kept unchanged. In this case, it is appropriate to decrease the oxygen content of the second processing gas 36-2 while the set temperature of the inner circulator 64-1 or the amount of heat generated by the inner heater 66-1, the oxygen content of the first processing gas 36-1, and the set temperature of the outer circulator 64-2 or the amount of heat generated by the outer heater 66-2 are kept unchanged in FIG. 2. If desired, the fine adjustments as described above with reference to FIG. 4B can be made to the outer portion of the specimen 1. This allows precise control of the CD shifts of the nondense portion and the dense portion in the outer portion of the specimen 1. A decrease in the oxygen content of the second processing gas 36-2 may cause a decrease in the oxygen content of the inner portion of the specimen 1. In such a case, to compensate for the decrease in the oxygen content of the inner portion of the specimen 1, it is appropriate to increase the oxygen content of the first processing gas 36-1. This allows the CD shift in the nondense portion in the outer portion of the specimen 1 to approach the target value while the CD shifts of the nondense portion and the dense portion in the inner portion of the specimen 1 and the CD shift in the dense portion in the outer portion are kept equal to or smaller than the target value. Thus, the nonuniformity of the CD shift caused by variations in the surface density can be reduced.

When the CD shift is equal to or smaller than a target value in the nondense portion but is smaller than the target value in the dense portion in the inner portion of the specimen 1, and when the CD shifts of the nondense portion and the dense portion are equal to or less than the target value in the outer portion of the specimen 1, it is appropriate to decrease the temperature and the oxygen concentration in the inner portion of the specimen 1 and keep the temperature and the oxygen concentration unchanged in the outer portion of the specimen 1. In this case, it is appropriate to decrease the set temperature of the inner circulator 64-1 or the amount of heat generated by the inner heater 66-1, decrease the oxygen content of the first processing gas 36-1, and keep the set temperature of the outer circulator 64-2 or the amount of heat generated by the outer heater 66-2 and the oxygen content of the second processing gas 36-2 unchanged in FIG. 2. If desired, the fine adjustments as described above with reference to FIG. 4C can be made to the inner portion of the specimen 1. This allows precise control of the CD shifts of the nondense portion and the dense portion in the inner portion of the specimen 1. A decrease in the temperature of the inner portion of the specimen 1 may cause a decrease in the temperature of the outer portion. In such a case, to compensate for the decrease in the temperature of the outer portion of the specimen 1, it is appropriate to increase the set temperature of the outer circulator 64-2 or the amount of heat generated by the outer heater 66-2. Similarly, a decrease in the oxygen content of the first processing gas 36-1 may cause a decrease in the oxygen content of the outer portion of the specimen 1. In such a case, to compensate for the decrease in the oxygen content of the outer portion of the specimen 1, it is appropriate to increase the oxygen content of the second processing gas 36-2. This allows the CD shift in the dense portion in the inner portion of the specimen 1 to approach the target value while the CD shifts of the nondense portion and the dense portion in the outer portion of the specimen 1 and the CD shift in the nondense portion in the inner portion are kept equal to or smaller than the target value. Thus, the nonuniformity of the CD shift caused by variations in the surface density can be reduced.

When the CD shifts of the nondense portion and the dense portion in the inner portion of the specimen 1 are equal to or smaller than the target value, and when the CD shift is equal to or smaller than the target value in the nondense portion but is smaller than the target value in the dense portion in the outer portion of the specimen 1, it is appropriate to decrease the temperature and the oxygen content of the outer portion while the temperature and the oxygen content of the inner portion of the specimen 1 are kept unchanged. In this case, it is appropriate to decrease the set temperature of the outer circulator 64-2 or the amount of heat generated by the outer heater 66-2 and decrease the oxygen content of the second processing gas 36-2 while the set temperature of the inner circulator 64-1 or the amount of heat generated by the inner heater 66-1 and the oxygen content of the first processing gas 36-1 are kept unchanged in FIG. 2. If desired, the fine adjustments as described above with reference to FIG. 4C can be made to the outer portion of the specimen 1. This allows precise control of the CD shifts of the nondense portion and the dense portion in the outer portion of the specimen 1. A decrease in the temperature of the outer portion of the specimen 1 may cause a decrease in the temperature of the inner portion. In such a case, to compensate the decrease in the temperature of the inner portion of the specimen 1, it is appropriate to increase the set temperature of the inner circulator 64-1 or the amount of heat generated by the inner heater 66-1. Similarly, a decrease in the oxygen content of the second processing gas 36-2 may cause a decrease in the oxygen content of the inner portion of the specimen 1. In such a case, to compensate for the decrease in the oxygen content of the inner portion of the specimen 1, it is appropriate to increase the oxygen content of the first processing gas 36-1. This allows the CD shift in the dense portion in the outer portion of the specimen 1 to approach the target value while the CD shifts of the nondense portion and the dense portion in the inner portion of the specimen 1 and the CD shift in the dense portion in the outer portion are kept equal to or smaller than the target value. Thus, the nonuniformity of the CD shift caused by variations in the surface density can be reduced.

When the CD shift is smaller than the target value in the nondense portion but is equal to or smaller than the target value in the dense portion in the inner portion of the specimen 1, and when the CD shifts of the nondense portion and the dense portion are equal to or smaller than the target value in the outer portion of the specimen 1, it is appropriate to increase the oxygen content of the inner portion of the specimen 1 while the temperature of the inner portion of the specimen 1 and the temperature and the oxygen content of the outer portion of the specimen 1 are kept unchanged. In this case, it is appropriate to increase the oxygen content of the first processing gas 36-1 while the set temperature of the inner circulator 64-1 or the amount of heat generated by the inner heater 66-1, the set temperature of the outer circulator 64-2 or the amount of heat generated by the outer heater 66-2, and the oxygen content of the second processing gas 36-2 are kept unchanged in FIG. 2. If desired, the fine adjustments as described above with reference to FIG. 4D can be made to the inner portion of the specimen 1. This allows precise control of the CD shifts of the nondense portion and the dense portion in the inner portion of the specimen 1. An increase in the oxygen content of the first processing gas 36-1 may cause an increase in the oxygen content of the outer portion of the specimen 1. In such a case, to compensate for the increase in the oxygen content of the outer portion of the specimen 1, it is appropriate to decrease the oxygen content of the second processing gas 36-2. This allows the CD shift in the nondense portion in the inner portion of the specimen 1 to approach the target value while the CD shifts of the nondense portion and the dense portion in the outer portion of the specimen 1 and the CD shift in the dense portion in the inner portion are kept equal to or smaller than the target value. Thus, the nonuniformity of the CD shift caused by variations in the surface density can be reduced.

When the CD shifts of the nondense portion and the dense portion in the inner portion of the specimen 1 are equal to or smaller than the target value, and when the CD shift is smaller than the target value in the nondense portion but is equal to or smaller than the target value in the dense portion in the outer portion of the specimen 1, it is appropriate to increase the oxygen content of the outer portion while the temperature and the oxygen content of the inner portion of the specimen 1 and the temperature of the outer portion of the specimen 1 are kept unchanged. In this case, it is appropriate to increase the oxygen content of the second processing gas 36-2 while the set temperature of the inner circulator 64-1 or the amount of heat generated by the inner heater 66-1, the oxygen content of the first processing gas 36-1, and the set temperature of the outer circulator 64-2 or the amount of heat generated by the outer heater 66-2 are kept unchanged in FIG. 2. If desired, the fine adjustments as described above with reference to FIG. 4D can be made to the outer portion of the specimen 1. This allows precise control of the CD shifts of the nondense portion and the dense portion in the outer portion of the specimen 1. An increase in the oxygen content of the second processing gas 36-2 may cause an increase in the oxygen content of the inner portion of the specimen 1. In such a case, to compensate for the increase in the oxygen content of the inner portion of the specimen 1, it is appropriate to decrease the oxygen content of the first processing gas 36-1. This allows the CD shift in the nondense portion in the outer portion of the specimen 1 to approach the target value while the CD shifts of the nondense portion and the dense portion in the inner portion of the specimen 1 and the CD shift in the dense portion in the outer portion are kept equal to or smaller than the target value. Thus, the nonuniformity of the CD shift caused by variations in the surface density can be reduced.

The control technique utilizing the temperature control of the specimen 1 and the flow rate control of a processing gas can also be applied independently to the inner portion and the outer portion of the specimen 1. This decreases the difference in the CD shifts of the nondense portion and the dense portion, thus reducing in-plane nonuniformity of the CD shift.

Figure 5A:
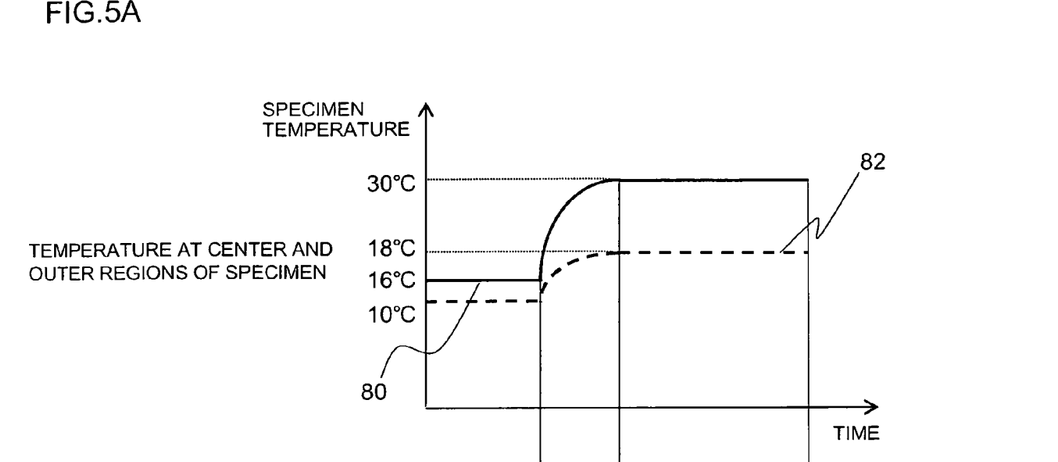
FIG. 5A is a graph illustrating the temperature of a specimen in Embodiment 2 of the present invention.
Figure 5B:
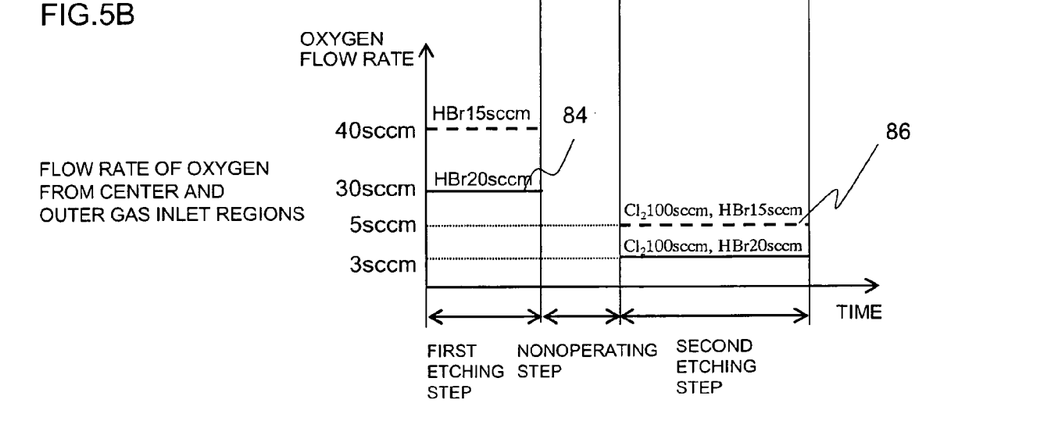
FIG. 5B is a graph illustrating the oxygen flow rate in Embodiment 2 of the present invention.

Embodiment 1 of the present invention does not describe an etching process under a plurality of processing conditions, that is, an etching process including a plurality of steps. In the etching of a plurality of films by an etching process including a plurality of steps, the type of the processing gas, the processing pressure, and other conditions often vary among the films. This variations may result in variations in the type of etching radicals or ions, the etching mechanism, the type and the amount of reaction product produced by etching, and the distribution of the reaction product in the processing chamber 26. Under such circumstances, the optimum in-plane temperature distribution of the specimen 1 or the optimum distribution of radicals and ions in plasma to achieve the target CD shift in each etching step often vary among the etching steps. In Embodiment 2 of the present invention, the structure and the control technique described in Embodiment 1 are applied to a gate etching process including a plurality of steps, as illustrated in FIG. 5.

Embodiment 2

An etching step 1 is the etching step of the antireflection coating 5, that is, a BARC etching step. The temperatures of the inner portion and the outer portion of the specimen 1 are adjusted to desired temperatures to achieve the target CD shift in the BARC etching step. For example, in the present embodiment, the desired temperatures are 16° C. at the center portion and 10° C. at the outer portion. The specimen 1 is heated by plasma 38 during etching. As described above, heat is transferred from the specimen 1 to the specimen holder 28 via a helium gas flowing between the specimen 1 and the specimen holder 28 to control the temperature of the specimen 1. In this case, the temperature of a refrigerant circulating in the specimen holder 28 must be lower than the temperature of the specimen 1. In the BARC etching step, to achieve the desired temperatures at the center portion and the outer portion of the specimen 1, the temperatures of the inner circulator 64-1 and the outer circulator 64-2 are set to be 12° C. and 6° C., respectively, and the amounts of heat of the inner heater 66-1 and the outer heater 66-2 are set to be 0 W. FIG. 5A illustrates the temperatures of the specimen 1. The temperature 80 at the center portion is indicated by a solid line. The temperature 82 at the outer portion is indicated by a broken line.

The flow rates and compositions of the first processing gas 36-1 and the second processing gas 36-2 are adjusted to respective desired values to achieve the target CD shift in the BARC etching step. In the present embodiment, the first processing gas 36-1 is composed of 20 sccm of hydrogen bromide (HBr) and 30 sccm of oxygen. The second processing gas 36-2 is composed of 15 sccm of hydrogen bromide and 40 sccm of oxygen. FIG. 5B illustrates the flow rate of oxygen, which has a greatest influence on the CD shift. The oxygen flow rate 84 in the first processing gas 36-1 is indicated by a solid line. The oxygen flow rate 86 in the second processing gas 36-2 is indicated by a broken line.

A nonoperating step follows the first etching step, the BARC etching step. In the nonoperating step, etching is not performed. The nonoperating step includes stopping the flows of the first processing gas 36-1 and the second processing gas 36-2 to the processing chamber 26, quenching the plasma 38, and removing the processing gas from the processing chamber. When the temperature of the specimen 1 in the second etching step is higher than that in the first etching step, the specimen 1 is heated with the inner heater 66-1 and the outer heater 66-2 to desired temperatures for the second etching step. In this case, the specimen 1 may be heated by increasing the set temperatures of the inner circulator 64-1 and the outer circulator 64-2. However, it is advantageous to use the inner heater 66-1 and the outer heater 66-2 in terms of responsiveness. Thus, the temperatures of the inner portion and the outer portion of the specimen 1 are adjusted to respective desired temperatures to achieve the target CD shift in the following polysilicon etching step. For example, in the present embodiment, the desired temperatures are 30° C. at the center portion and 18° C. at the outer portion. To this end, in the polysilicon etching step, the set temperatures of the inner circulator 64-1 and the outer circulator 64-2 are the same as those in the first etching step, that is, 12° C. and 6° C., respectively. The amounts of heat of the inner heater 66-1 and the outer heater 66-2 are 200 W and 160 W, respectively. These controls are performed in the nonoperating step. When the temperatures of the specimen 1 reaches the respective desired temperatures, the polysilicon etching step is started as the second etching step. In the present embodiment, the nonoperating step takes 30 seconds. The flow rates and compositions of the first processing gas 36-1 and the second processing gas 36-2 are adjusted to respective desired values to achieve the target CD shift of the second etching step, the polysilicon etching step. In the present embodiment, the first processing gas 36-1 is composed of 100 sccm of chlorine, 20 sccm of hydrogen bromide, and 3 sccm of oxygen. The second processing gas 36-2 is composed of 100 sccm of chlorine, 15 sccm of hydrogen bromide, and 5 sccm of oxygen.

As described above, in the etching process including a plurality of steps, the set temperatures of the inner circulator 64-1 and the outer circulator 64-2, the amounts of heat generated by the inner heater 66-1 and the outer heater 66-2, and the flow rates and the compositions of the first processing gas 36-1 and the second processing gas 36-2 are controlled independently in each etching step. As described above, in an etching process including a plurality of steps, the optimum in-plane temperature distribution of the specimen 1 or the optimum distribution of radicals and ions in plasma to achieve the target CD shift in each etching step often vary among the etching steps. Thus, it is very effective to control the temperatures at the center portion and the outer portion of the specimen 1 and the concentration of radicals or ions on the surface of the specimen 1 independently in each etching step. In consequence, these procedures can improve in-plane uniformity of the CD shift of the specimen 1.

In Embodiment 2 of the present invention, the nonoperating step, in which etching is not performed on the specimen 1, is present between the etching steps. In the nonoperating step, the temperature distribution of the specimen 1 is adjusted to the desired temperature distribution in the second etching step. The nonoperating step undesirably decreases the throughput. However, the temperature distributions of the specimen 1 to achieve the target CD shifts of the first etching step and the second etching step are different. Thus, continuous etching through the first etching step and the second etching step without the nonoperating step cannot achieve the target CD shift of the second etching step, causing in-plane nonuniformity of the CD shift.

Embodiment 3

Embodiment 3 of the present invention is described below with reference to FIG. 6. In the present embodiment, the structures and the control techniques described in Embodiments 1 and 2 are applied to a gate etching process including a plurality of steps of a BARC etching step and a polysilicon etching step but not including a nonoperating step.

Figure 6A:
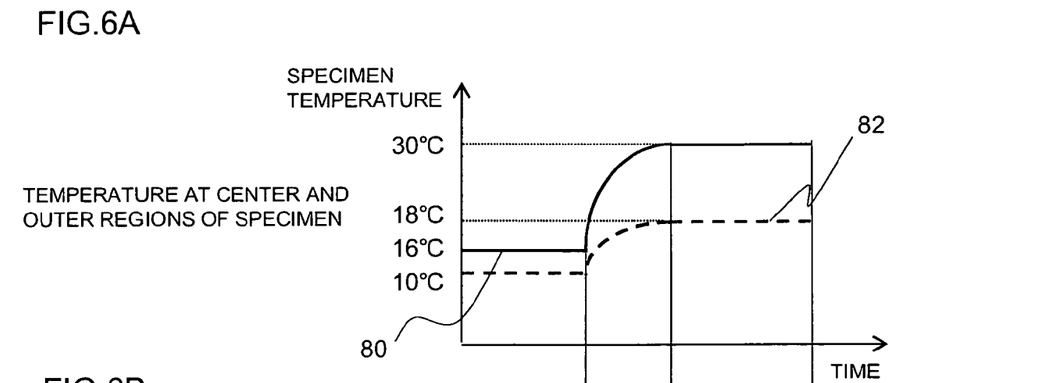
FIG. 6A is a graph illustrating the temperature of a specimen in Embodiment 3 of the present invention.
Figure 6B:
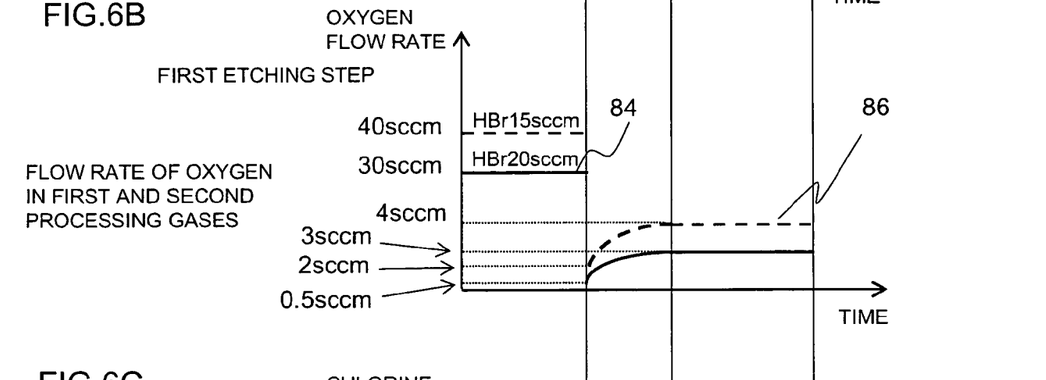
FIG. 6B is a graph illustrating the oxygen flow rate in Embodiment 3 of the present invention.
Figure 6C:
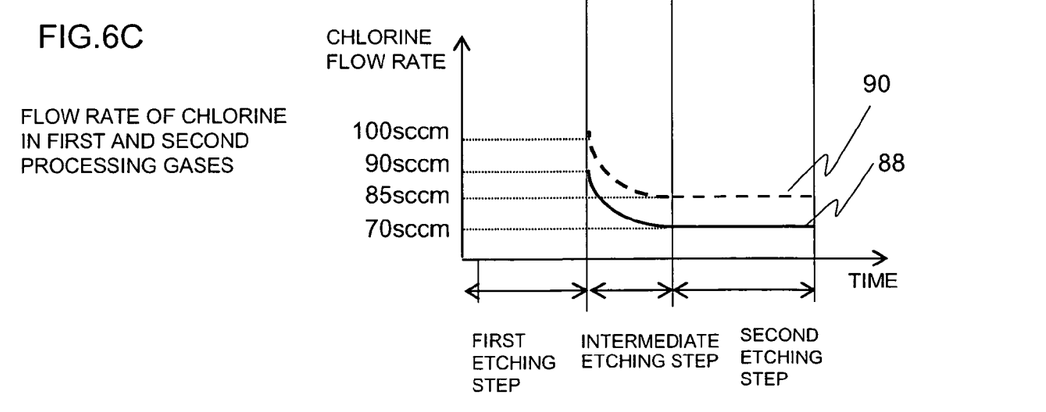
FIG. 6C is a graph illustrating the chlorine flow rate in Embodiment 3 of the present invention.

FIG. 6A illustrates the temperatures at the center portion and the outer portion of the specimen 1. The temperature 80 at the center portion is indicated by a solid line. The temperature 82 at the outer portion is indicated by a broken line. FIG. 6B illustrates the flow rates of oxygen in the first processing gas 36-1 and the second processing gas 36-2. The oxygen flow rate 84 in the first processing gas 36-1 is indicated by a solid line. The oxygen flow rate 86 in the second processing gas 36-2 is indicated by a broken line. FIG. 6C illustrates the flow rates of chlorine flowing through the central gas inlet region 42-1 and the outer gas inlet region 42-2. The chlorine flow rate 88 in the first processing gas 36-1 is indicated by a solid line. The chlorine flow rate 90 in the second processing gas 36-2 is indicated by a broken line.

The first etching step is the etching step of the antireflection coating 5, that is, the BARC etching step. The temperatures of the inner portion and the outer portion of the specimen 1 are adjusted to desired temperatures to achieve the target CD shift of the BARC etching step. For example, in the present embodiment, the desired temperatures are 16° C. at the center portion and 10° C. at the outer portion. In the BARC etching step, to achieve the desired temperatures, the temperatures of the inner circulator 64-1 and the outer circulator 64-2 are set to be 12° C. and 6° C., respectively, and the amounts of heat of the inner heater 66-1 and the outer heater 66-2 are set to be 0 W. The flow rates and compositions of the first processing gas 36-1 and the second processing gas 36-2 are adjusted to respective desired values to achieve the target CD shift of this step. In the present embodiment, the first processing gas 36-1 is composed of 20 sccm of hydrogen bromide and 30 sccm of oxygen. The second processing gas 36-2 is composed of 15 sccm of hydrogen bromide and 40 sccm of oxygen. The chlorine flow rates of the first processing gas 36-1 and the second processing gas 36-2 are 0 sccm.

An intermediate etching step follows the first etching step, the BARC etching step. The discharge of plasma 38 is continued through the first etching step and the second etching step following the intermediate etching step. When the temperature of the specimen 1 in the second etching step is higher than that in the first etching step, the specimen 1 is heated with the inner heater 66-1 and the outer heater 66-2 in the intermediate etching step to desired temperatures for the second etching step. For example, in the present embodiment, the desired temperatures are 30° C. at the center portion and 15° C. at the outer portion. To this end, in the polysilicon etching process, the set temperatures of the inner circulator 64-1 and the outer circulator 64-2 are the same as those in the first etching step, that is, 12° C. and 6° C., respectively. The amounts of heat of the inner heater 66-1 and the outer heater 66-2 are 150 W and 120 W, respectively. These amounts of heat of the heaters are smaller than those in the nonoperating step in Embodiment 2. This is because the specimen 1 is heated by plasma 38 continuously discharged during the intermediate etching step.

In the present embodiment, the temperature of the specimen 1 in the second etching step must be higher than that in the first etching step to achieve the target CD shift of the second etching step. If the processing gas introduced into the processing chamber 26 is not controlled, the CD shift of the second etching step becomes larger than the target value. This is because the sticking coefficient of a reaction product increases as the temperature of the specimen 1 decreases. This is compensated for by decreasing the deposition of the reaction product. Thus, at the beginning of the intermediate etching step, in which the temperature of the specimen 1 is low, to decrease the deposition of the reaction product, the oxygen flow rate is decreased to reduce the deposition power of the reaction product. In addition, a larger amount of chlorine is introduced at the beginning of the intermediate etching step than at the end of the intermediate etching step to promote the isotropic etching of a protective film deposited on the side wall of the gate electrode 7 during etching. In the present embodiment, the oxygen flow rate and the chlorine flow rate are 0.5 sccm and 90 sccm in the first processing gas 36-1 and 2 sccm and 100 sccm in the second processing gas 36-2, respectively. As described above, the temperature of the specimen 1 is continuously controlled in the intermediate etching step until the temperature reaches the set temperature in the second etching step. Thus, the temperature varies over time. In the present embodiment, the temperature of the specimen 1 is continuously increased and accordingly the sticking coefficient of a reaction product decreases over time. In the present embodiment, the deposition power of the reaction product is gradually increased by increasing oxygen flow rates of the first processing gas 36-1 and the second processing gas 36-2. This cancels out a decrease in the sticking coefficient of the reaction product due to temperature increase. At the same time, the chlorine flow rates of the first processing gas 36-1 and the second processing gas 36-2 are gradually decreased to reduce the isotropic etching over time. Thus, a vertically well-defined etching shape can also be achieved in the intermediate etching step.

The temperatures of the inner portion and the outer portion of the specimen 1 are different at the beginning and the end (the beginning of the second etching step) of the intermediate etching step. Thus, the temperatures of the specimen 1 are differently changed (increased in the present embodiment) at the inner portion and the outer portion. Thus, it is important to control the compositions and the flow rates of the first processing gas 36-1 and the second processing gas 36-2 independently. In the present embodiment, the oxygen flow rate and the chlorine flow rate of the first processing gas 36-1 are changed from 0.5 sccm to 3 sccm and from 90 sccm to 70 sccm, respectively, in response to temperature increase. In the same manner, the oxygen flow rate and the chlorine flow rate of the second processing gas 36-2 are changed from 2 sccm to 4 sccm and from 100 sccm to 85 sccm, respectively.

The control procedure of the flow rates and the compositions of the first processing gas 36-1 and the second processing gas 36-2 may be previously determined on the basis of the temperature change of the specimen 1 previously measured. Alternatively, the flow rates and the compositions of the first processing gas 36-1 and the second processing gas 36-2 may be controlled on the basis of the temperature of the specimen 1 determined from the temperatures of the inner portion and the outer portion of the specimen holder 28 measured with the inner thermometer 68-1 and the outer thermometer 68-2 provided in the specimen holder 28 during etching. The latter procedure is preferred because etching is performed more precisely.

At the end of the intermediate etching step, the flow rates and the compositions of the first processing gas 36-1 and the second processing gas 36-2, the set temperatures of the inner circulator 64-1 and the outer circulator 64-2, and the amounts of heat of the inner heater 66-1 and the outer heater 66-2 reach initial set values of the second etching step. Thus, the intermediate etching step can directly be followed by the second etching step.

As a consequence, the target CD shift and therefore excellent in-plane uniformity of etching are achieved at the inner portion and the outer portion of the specimen 1. In addition, the continuous etching without a nonoperating step between a plurality of etching steps can improve the throughput.

As described above, the temperature of the specimen 1 and the concentrations of an etchant and a reaction product must be controlled to achieve etching successfully. To this end, the set temperatures of the inner circulator 64-1 or the outer circulator 64-2, the amounts of heat of the inner heater 66-1 or the outer heater 66-2, and the compositions (flow ratio of a plurality of processing gas components) and overall flow rates of the first processing gas 36-1 or the second processing gas 36-2 are controlled in the present embodiment. In addition, independent control of these variables at the central portion and the outer portion allows etching with excellent etch rate and high in-plane uniformity of the CD shift even in a specimen 1 having a large diameter.

While the UHF-ECR etching apparatus is described in the embodiments of the present invention, the plasma source is not limited to it. For example, the present invention can also be applied to an etching apparatus with a capacitively-coupled plasma source.

In Embodiments 2 and 3, the temperatures of the center portion and the outer portion of the specimen 1 are higher in the second etching step than in the first etching step. However, when the temperatures are lower in the second etching step than in the first etching step, etching with high in-plane uniformity of the CD shift can also be performed in the same way according to the present invention.

As described above, the present invention provides a plasma etching apparatus with which a specimen having a large diameter can be etched with high in-plane uniformity, and a plasma etching method using the plasma etching apparatus.

What is claimed is:

1. A plasma etching method using a plasma etching apparatus, the plasma etching apparatus comprising:

a processing chamber in which a specimen is subjected to plasma etching processing;

a specimen holder for holding the specimen;

a gas supply source for supplying processing gases to the processing chamber;

a first gas inlet for introducing the processing gases to a center portion of the specimen;

a second gas inlet for introducing the processing gas to an outer portion of the specimen;

a first temperature controller provided in the specimen holder for controlling temperature at the center portion of the specimen;

a second temperature controller provided in the specimen holder for controlling temperature at the outer portion of the specimen;

a regulator for independently controlling the compositions or the flow rates of the processing gases introduced from the first gas inlet and from the second gas inlet and the temperature controlled with the first temperature controller and the second temperature controller; and an electromagnetic wave supply unit for sending an electromagnetic wave into the processing chamber, wherein the plasma etching method comprises:

a first etching step of adjusting the temperatures of the center portion and the outer portion of the specimen to desired temperatures, and the flow rates and compositions of the first and second processing gases to desired values respectively;

an intermediate etching step of heating the specimen by a heater to a desired temperature used in a subsequent, second etching step, and controlling the flow rates and compositions of the first and second processing gases independently; and the second etching step following the intermediate etching step and continuing plasma etching under desired etching conditions, wherein:

the intermediate etching step is a transferring period from the temperature of the center portion and the outer portion of the specimen in the first etching step to a temperature of the center portion and the outer portion of the specimen in the second etching step;

a kind of etching gas used in the intermediate etching step is the same as that used in the second etching step; and a flow rate of etching gas supplied to the center portion and the outer portion of the specimen in the intermediate etching step is changed gradually from a predetermined gas flow rate to the gas flow rate to be used in the second etching step according to the temperature change of the center portion and the outer portion of the specimen, respectively.

2. The plasma etching method according to claim 1, wherein said specimen has at least first and second portions, and wherein a photoresist mask, through which the specimen is etched, has photoresist mask parts closer to each other in the first portion than a distance between photoresist mask parts in the second portion.

3. The plasma etching method according to claim 1, wherein said specimen has a plurality of layers etched in the first and second etching steps.

4. The plasma etching method according to claim 1, wherein the first etching step of adjusting the temperatures of the center portion and the outer portion adjusts the temperatures of the center and outer portions independently.

* * * * *